United States Patent [19]
Henrik et al.

[11] Patent Number: 5,202,646
[45] Date of Patent: Apr. 13, 1993

[54] OUTPUT STAGE FOR AMPLIFIERS

[75] Inventors: Gutsch Henrik; Rebmann Volkmara, both of Heilbronn; Schnabel Jürgen, Ilsfeld, all of Fed. Rep. of Germany

[73] Assignee: Telefunken Electronic GmbH, Heilbronn, Fed. Rep. of Germany

[21] Appl. No.: 780,784

[22] Filed: Oct. 23, 1991

[30] Foreign Application Priority Data

Nov. 15, 1990 [DE] Fed. Rep. of Germany ....... 4036406

[51] Int. Cl.$^5$ ............................................... H03F 3/26
[52] U.S. Cl. .................................. 330/271; 330/270; 330/263
[58] Field of Search ................ 330/271, 270, 262, 263

[56] References Cited

U.S. PATENT DOCUMENTS

| | | | |
|---|---|---|---|
| 3,418,590 | 12/1968 | Rongen et al. | 330/270 |
| 3,462,698 | 8/1969 | Yagher | 330/271 |
| 4,025,871 | 5/1977 | Peil | 330/262 |
| 4,050,029 | 9/1977 | McFadyen | 330/297 |
| 4,538,116 | 8/1985 | Vyne | 330/271 |

FOREIGN PATENT DOCUMENTS

| | | |
|---|---|---|
| 2605934 | 8/1977 | Fed. Rep. of Germany . |
| 2729722 | 1/1978 | Fed. Rep. of Germany . |
| 3136835 | 4/1982 | Fed. Rep. of Germany . |
| 3416850 | 11/1984 | Fed. Rep. of Germany . |

OTHER PUBLICATIONS

GB Z: Solid-State Audio Power. In: Electronics World + Wireless World, Nov. 1989, pp. 1042-1048.

*Primary Examiner*—Robert J. Pascal
*Assistant Examiner*—Tan Dinh
*Attorney, Agent, or Firm*—Spencer, Frank & Schneider

[57] ABSTRACT

An output stage for an amplifier includes first and second load current-carrying n-p-n output transistors disposed in different respective amplifier branches having different amplification properties. Negative feedback and limiting circuitry provides a negative feedback current to the first one of the output transistors and limits the negative feedback current to a preselected maximum value over a predetermined output current range whereby the amplification properties of the first one of the output transistors are affected in a range of output voltages of the amplifier stage.

18 Claims, 1 Drawing Sheet

OUTPUT STAGE FOR AMPLIFIERS

BACKGROUND OF THE INVENTION

Amplifier particularly operational amplifiers are as a rule constructed in several stages; in addition to a differential input stage and an output stage or end stage, further amplifier stages are optionally provided between these two stages. Whereas the input stage is substantially used for setting the amplification, the output stage primarily provides current to the load, which can fluctuate over a wide range depending on the application of the amplifier. In addition, it is desirable that the output stage should have low distortion and a low output resistance, and should not impair the amplification properties of the amplifier stage.

To ensure a large output voltage rise, and to improve the frequency response of the amplifier, so-called all-n-p-n push-pull output stages are used, in which n-p-n transistors are exclusively responsible for providing of the load current. In the quiescent state of the amplifier (no load current), a low (cross) current flows through the output transistors; the potential at the output of the output stage adjusts to a quiescent potential or balanced potential corresponding to approximately half the supply voltage. Under load, an output transistor should provide the current required to raise the output potential (positive half-wave), and in the case of a drop in the output potential another transistor should pick up the necessary current (negative half-wave). This is achieved by the transistors being triggered in complementary fashion by respective push and pull signals; the necessary amplifier circuits however have greatly differing amplification properties. The output transistors alternate depending on the polarity of the output voltage in the load current carried, with the possibility existing here of the output transistors being briefly without current during a change from the positive to the negative half-wave of the output voltage (non-ideal current transfer), hence causing a gap in the transmission or transfer characteristic. The quiescent (cross) current mentioned does avoid such gaps during current transfer, but the widely differing amplification properties of the output transistors cause major non-linearities in the transmission characteristic, which, particularly in the range of the balanced state, lead to a sharp kink in the characteristic; as a result, however, the transmission characteristics of the amplifier too, particularly at low output voltages, are very greatly impaired (distortions, high distortion factor etc.). To reduce the kink in the transmission characteristic during current transfer, the amplification properties—particularly in the range of the balanced state—must be matched to one another.

SUMMARY OF THE INVENTION

The object underlying the invention is therefore to provide an output stage for amplifiers that has good properties, in particular low non-linearities and low distortions, even at low output voltages.

This object is attained in accordance with the invention by providing in an amplifier output stage having first and second output transistors, negative feedback and current limiting means by which the amplification properties of an output transistor are affected in a certain range of the output voltage of the amplifier stage.

Advantageous embodiments of the invention are stated in the sub-claims.

In accordance with the invention, the base current of the output transistor in the amplifier branch with the higher amplification is reduced by a current proportional to the output transistor's emitter current being subtracted from the base of the output transistor by a negative current feedback circuit comprising several transistors. In addition, a limitation of the negative current feedback to the transition range or transfer range of the transmission characteristic using a limiter circuit is achieved by the current subtracted from the base of the transistor being limited to a certain presettable maximum value. The factor of negative current feedback and the range in which this is to be effective can be preset or adjusted as required by suitably dimensioning the circuit components involved.

The output stage in accordance with the invention combines a number of advantages:
- the negative feedback amplification can be set precisely within a wide range of values, thereby permitting a high linearity in the output stage even with low saturations; because of the negative feedback, all types of non-linearity present in the transmission characteristic of the output stage are reduced
- selection of surface ratios, currents and resistances of the negative feedback circuit and hence of the feedback factors ensure a large number of possibilities for intervention to optimize the amplifier stage
- it has only two load-current-carrying n-p-n output transistors, which must be dimensioned for the respective load current; all other transistors not involved in carrying load current and required for negative current feedback and current limitation can be minimized, so that less space is required
- the negative feedback reduces—particularly in the case of high outputs—the quiescent current of the output stage too, thereby stabilizing the latter.

BRIEF DESCRIPTION OF THE DRAWINGS

The amplifier stage in accordance with an embodiment the invention is described in detail with reference to the drawings, in which.

DESCRIPTION OF A PREFERRED EMBODIMENT

Figure 1:
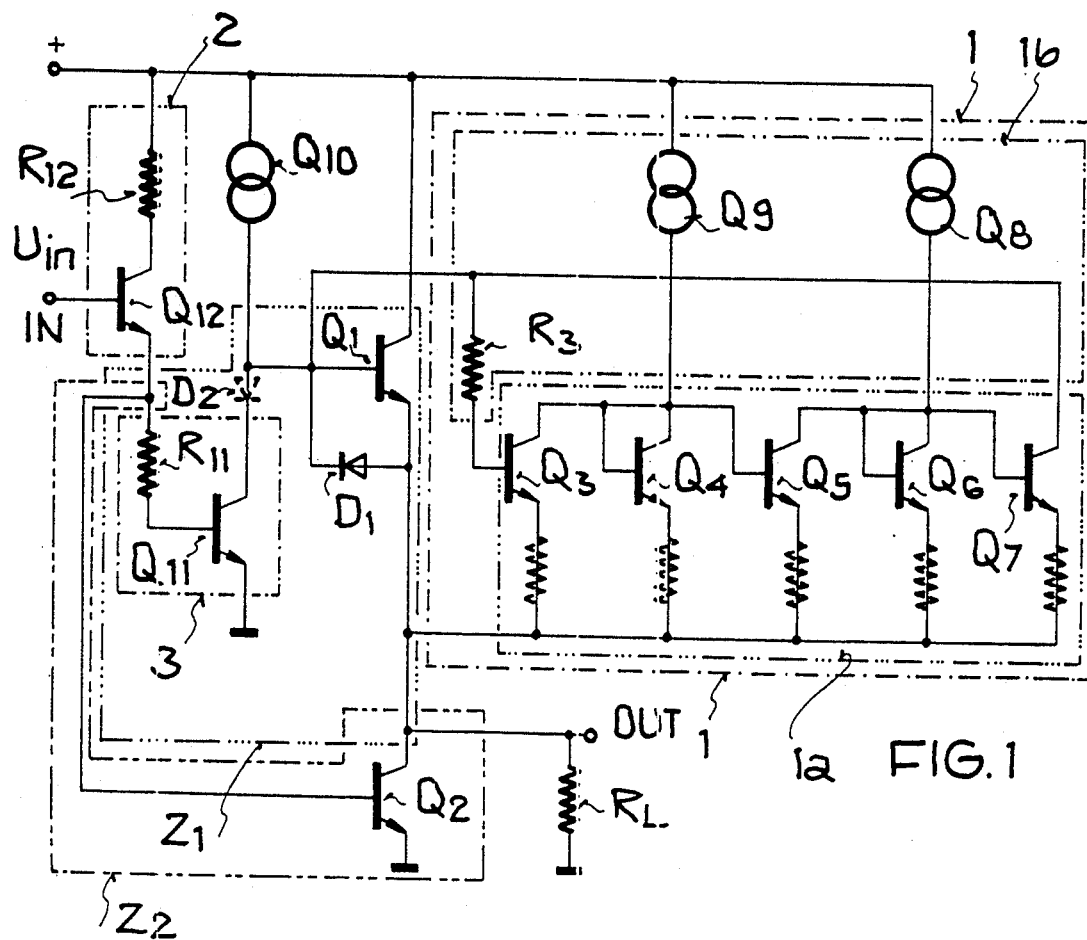
FIG. 1 shows a circuit diagram of the amplifier stage.

With reference to with FIG. 1, the output stage has two n-p-n output transistors $Q_1$ and $Q_2$ in different amplifier branches $Z_1$ and $Z_2$. The output transistors $Q_1$ and $Q_2$ are involved in carrying load current such that the first output transistor, $Q_1$ only carries current during the "positive half-cycle" of the output voltage and the second output transistor $Q_2$ only during the "negative half-cycle". In the transition range or quiescent state of the circuit, a cross current flows through both output transistors, and is, for example approximately 5% by the maximum load current. For complementary triggering of the two transistors, the input voltage, $U_{IN}$—which is for example the output voltage of an input stage or another amplifier stage connected in front—is supplied in the first amplifier branch $Z_1$ to the base of the first output transistor $Q_1$ by an emitter circuit 3 ($R_{11}$, $Q_{11}$) and in the second amplifier branch Z2 to the base of the second output transistor $Q_2$. The emitter-follower transistor $Q_{12}$ is connected in front—amplification $V=1$, high input resistance, low output resistance—and the input voltage $U_{IN}$ is applied to the base of $Q_{12}$. The collector of $Q_{12}$ is connected to the supply voltage via the limiting resistor $R_{12}$. Transistor $Q_{12}$ serves as a buffer amplifier 2 for decoupling the output stage from previous amplifier stages.

The second output transistor $Q_2$ is directly triggered by the emitter-follower transistor $Q_{12}$ and acts as an emitter circuit loaded by the output or load resistor $R_L$. The amplification $V_2$ of the second amplifier branch $Z_2$ (output transistor $Q_2$) can therefore be stated as follows:

$$V_2 = -k \cdot R_L = -\frac{I_{C2}}{U_T} \cdot R_L \quad (1)$$

where k is the transconductance of the transistor $Q_2$, $R_L$ the load resistor, $I_{C2}$ the collector current of transistor $Q_2$, and $U_T$ the so-called temperature voltage. The amplification $V_2$ therefore depends heavily on the (external) load resistor $R_L$ and on the collector current of the transistor $Q_2$ or on its quiescent current, and accordingly also on the saturation of the amplifier stage.

The first output transistor $Q_1$ is triggered by the emitter-follower 2—transistor $Q_{12}$—and the emitter circuit 3—resistor $R_{11}$, control transistor $Q_{11}$, with resistor $R_{11}$ serving to limit the base current of $Q_{11}$, and the current source $Q_{10}$ connected to the collector of transistor $Q_{11}$ the transistors $Q_{11}$ and $Q_1$. Since the output transistor $Q_1$ represents the load of the control transistor $Q_{11}$ in the emitter circuit and itself acts as an emitter-follower with regard to the load resistor $R_L$, the amplification $V_1$ of the first amplifier branch $Z_1$ (output transistor $Q_1$) is expressed as:

$$V_1 = -\beta \cdot R_L \cdot \frac{I_{C11}}{U_T} \quad (2)$$

where $\beta$ is the current amplification of the output transistor $Q_1$ and $I_{C11}$ the collector current of transistor $Q_{11}$. The equation (2) shows, firstly that $V_1$ is large compared to $V_2$ because of the factor $\beta$, and secondly that $V_1$ is, unlike $V_2$ (equation 1), independent of the saturation in the first approximation.

The optional diode $D_2$ connected between the collector of the transistor $Q_{11}$ and the base of the transistor $Q_1$ can be used for decoupling the collector of the transistor $Q_{11}$ from the output, and the diode $D_1$ between base and emitter of the transistor $Q_1$ serves as a protective diode for this transistor to avoid a voltage breakthrough across its base-emitter junction.

To match the amplification $V_1$ of the first output transistor $Q_1$ to the lower value $V_2$, it is necessary in accordance with equation (2) to reduce the input resistance ($\beta \cdot R_L$) of the output transistor $Q_1$, but only in the range of the balanced state of the output stage. This is achieved according to the invention by a combination of negative current feedback and current where the negative current feedback circuit with limitation in accordance with FIG. 1 contains the current mirror transistors $Q_3$-$Q_6$, the uncoupling transistor $Q_7$, the current sources $Q_8$ and $Q_9$, and the resistor $R_3$.

The entire negative feedback current $I_{Gk}$ comprises the base current $I_{B3}$ of the first current mirror transistor $Q_3$ and the collector current $I_{C7}$ of the transistor $Q_7$. The transistors $Q_3$, $Q_4$ and $Q_9$ form a first current difference, the transistors $Q_5$, $Q_6$ and $Q_8$ a second current difference, to generate a feedback current that is proportional to the emitter current $I_1$ of the first output transistor $Q_1$ and that acts as the collector current $I_{C7}$ of the transistor $Q_7$ on the base input of transistor $Q_1$.

The range in which the negative feedback is active can be set, using the resistor $R_3$ and selecting the currents of the current sources $Q_8$ and $Q_9$, by limiting the feedback current $I_{Gk}$ to a maximum value using the resistor $R_3$ and the two current sources $Q_8$ and $Q_9$. The resistor $R_3$ here limits the base current $I_{B3}$, and the current sources $Q_8$ and $Q_9$ limit the collector current $I_{C7}$.

The factors of the negative current feedback can be affected by the dimensioning of the circuitry components used:

a) Feedback current:

The amount of the emitter current $I_1$ of the output transistor $Q_1$ is determined by the first current mirror transistor $Q_3$, with the current mirror transistor $Q_3$ copying the current $I_1$ and—depending on the surface ratio $A_1/A_3$ of the emitter surfaces of transistors $Q_1$ and $Q_3$—supplying a current $I_3 = I_1 \cdot A_3/A_1$, proportional to current $I_1$, to the further circuit.

Successive use of the current mirror property of transistors $Q_4$ to $Q_6$ generates a current $I_6$ at the collector of transistor $Q_6$ that is proportional to current $I_3$ and hence to current $I_1$. The transistor $Q_7$ feeds the current $I_6$ back to transistor $Q_1$; this part of the feedback current $I_{C7}$—which is subtracted from the base current of transistor $Q_1$ in addition to current $I_{B3}$—is calculated as:

$$I_{C7} = k_{ges} \cdot I_1 \quad (3)$$

with $$k_{ges} = \frac{A_3 \cdot A_5 \cdot A_5}{A_1 \cdot A_4 \cdot A_6} \quad (4)$$

Factors $A_1$ and $A_3$ to $A_7$ are here the emitter surfaces of transistors $Q_1$ and $Q_3$ to $Q_7$.

As can be gathered from equations (3) and (4), the size of the feedback current $I_{C7}$, and hence the required reduction of the input resistance and accordingly of the amplification $V_1$ of the first amplifier branch $Z_1$ (output transistor $Q_1$), can be preset as required by selecting the emitter surfaces $A_1$ and $A_3$ to $A_7$ of transistors $Q_1$ and $Q_3$ to $Q_7$.

A further possibility is to influence the negative feedback factor with one or more emitter resistors of transistors $Q_3$ to $Q_7$.

b) Feedback range

The limiter circuit 1b should become active when the transfer range is left, i.e. when the output current of the amplifier stage exceeds a certain threshold value; in this case, only a low constant current should be subtracted from the base of transistor $Q_1$. To limit the effect of the negative feedback to the transfer range, the resistor $R_3$ and the two current sources $Q_8$ and $Q_9$ become effective in the following manner:

$R_3$ limits the base current $I_{B3}$ of transistor $Q_3$ when the emitter current $I_1$ of transistor $Q_1$ exceeds a certain value, i.e. when the transfer range is left; as long as the current $I_1$ is low, i.e. in the transfer range, $R_3$ has no significant function. The value of the maximum base current $I_{B3max}$ is approximately given by the relationship $I_{B3max} \approx 150$ mV/$R_3$.

The two current sources $Q_8$ and $Q_9$ limit the feedback current $I_{C7}$ to a presettable maximum value $I_{C7max}$. The relationship $I_9=I_3+I_4$ applies and hence $I_3 \leq I_9$, i.e. $I_{3max}=I_9$; furthermore: $I_8=I_6+I_5$, hence $I_6=I_8-I_5$, i.e. $I_6 \leq I_8$ and $I_{6max}=I_8$. On account of $I_{C7}=I_6 \cdot A_7/A_6$, $I_{C7}$ can at the most assume the value $I_{C7max}=I_8 \cdot A_7/A_6$, where $I_8$ can be preset by the two current sources $Q_9$ and $Q_8$ in accordance with the relationship $I_9 \cdot A_5 = I_8 \cdot A_4$.

Figure 2:
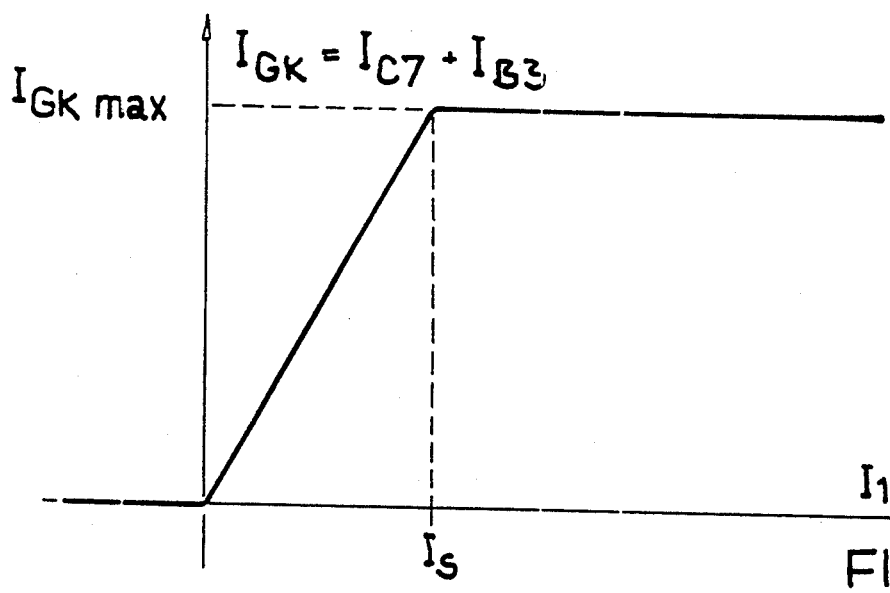
FIG. 2 shows on exemplary curve the negative feedback current, having a linear form in the transition range.

This principle of the limiter circuit is made clear in FIG. 2, where the negative feedback current $I_{Gk}=I_{C7}+I_{B3}$ is represented as a function of the emitter current $I_1$ of the first output transistor $Q_1$. As long as the negative feedback is active, the negative feedback current $I_{Gk}$ rises in the transition range linearly with current $I_1$. the limiter circuit becomes effective at a certain presettable threshold value $I_s$—for example 100 μA; with higher current values, $I_1>I_s$, the constant current $I_{Gkmax}=I_{C7max}+I_{B3max}$, which is independent of $I_1$ and dependent on $R_3$ and $Q_8$ or $Q_9$, is subtracted from the base of the first output transistor $Q_1$.

The amplifier output stage in accordance with the invention can be used, among other applications, in LF amplifiers, for example in the telecommunications field, the hifi field, in electronic entertainment equipment or in two-way radios.

When used as a line amplifier in a telephone system, with a maximum AC current of 5 mA and a quiescent current of 500 μA, $k_{ges}=\frac{1}{2}$, for example, was selected for the feedback factor, and the threshold value current $I_8$ was set at 20 μA and the threshold value current $I_{B3max}$ at approx. 15 μA.

In a further application in microphone amplifiers, with a maximum AC current of 1 mA and a quiescent current of 300 μA, $k_{ges}=8$ was selected for the feedback factor, and 40 μA was set for the threshold value current $I_8$ and approx. 40 μA for $I_{B3max}$.

What is claimed is:

1. An output stage for an amplifier comprising:
   first and second load current-carrying n-p-n output transistors disposed in different respective amplifier branches having different amplification properties; and
   negative feedback and current limiting means for providing a negative feedback current to the first circuit to the first output transistor to a preselected maximum value over a predetermined output current range
   whereby the amplification properties of the first output transistor are affected for a range of output voltages of the amplifier stage.

2. An output stage according to claim 1, wherein the negative feedback and current limiting means comprises:
   a negative current feedback circuit; and
   a limiter circuit;
   wherein the negative feedback circuit and the limiter circuit are operatively connected to the first output transistor, the first output transistor having a higher amplification than the second output transistor,
   wherein said negative current feedback circuit generates the negative feedback current and provides the negative feedback current to the base of the first output transistor, and
   wherein the negative feedback current is limited to the preselected maximum value by the limiter circuit.

3. An output stage according to claim 2,
   wherein the negative current feedback circuit comprised a plurality of current mirror transistors connected in series, one of the current mirror transistors serving as an uncoupling transistor,
   wherein emitters and bases of the first output transistor and a first one of the plurality of current mirror transistors are connected one of directly and via at least one resistor whereby a first part of the negative feedback current is provided by the base current of the first current mirror transistor,
   wherein the emitter current of the first output transistor is determined by the first current mirror transistor,
   wherein emitters of further ones of the plurality of current mirror transistors and of the uncoupling transistor are connected to one another whereby a linear multiple of the emitter current of the first output transistor is formed, and
   wherein the collector of the uncoupling transistor is connected to the base of the first output transistor, whereby a second part of the negative feedback currant is provided by the collector current of the uncoupling transistor.

4. An output stage according to claim 3, wherein the amount of the second part of the negative feedback current is determined by emitter surfaces of the plurality of current mirror transistors.

5. An output stage according to claim 3, wherein the limiter circuit includes a limiter resistor and first and second current source transistors.

6. An output stage according to claim 5, wherein the limiter resistor is connected at one end to the base of the first output transistor and at the other end to the base of the first current mirror transistor, whereby the base current of the first current mirror transistor is limited to a maximum value determined by the limiter resistor.

7. An output stage according to claim 5,
   wherein the first current source transistor is connected to collectors of the first and a second one of the plurality of current mirror transistors and to the base of a third one of the plurality of current mirror transistors,
   wherein the second current source transistor is connected to the collectors of the third and a fourth one of the plurality of current mirror transistors and to the base of the uncoupling transistor, and
   wherein the collector current of the uncoupling transistor is limited to a maximum value determined by a first current difference formation comprising the first and second current mirror transistors and the second current source transistor, and a second current-difference formation comprising the third and fourth current mirror transistors and the first current source transistor.

8. An output stage according to claim 3, wherein emitter resistors are disposed in the emitter branch of at least one of the plurality of current mirror transistors.

9. An output stage according to claim 1,
   wherein an emitter-follower circuit comprising a buffer amplifier transistor is provided at the input of the output stage to buffer an input voltage, and
   wherein the input voltage is applied to the base of the buffer amplifier transistor.

10. An output stage according to claim 9, wherein the emitter of the buffer amplifier transistor is connected directly to the base of the second output transistor and is connected by an emitter circuit to the base of the first output transistor.

11. An output stage according to claim 5, further comprising a third current source transistor wherein the base of the first output transistor is connected to the third current source transistor.

12. An output stage according to claim 1, wherein an external load is connected to an output which is formed by the emitter of the first output transistor and the collector of the second output transistor.

13. An output stage according to claim 1, wherein the base and the emitter of the first output transistor are connected to one another with a diode.

14. An output stage according to claim 10, wherein the emitter circuit comprises an emitter circuit transistor, the collector of the emitter circuit transistor and the base of the first output transistor being connected to one another with a diode.

15. An output stage according to claim 1, wherein the output stage is formed as an integrated circuit.

16. A push-pull amplifier comprising:
input circuit means for receiving and buffering an input signal and providing push and pull signals;
first and second npn output transistors operatively coupled to the input circuit means, the first output transistor receiving the push signal and the second output transistor receiving the pull signal at respective bases thereof, the emitter of the first npn output transistors being connected to the collector of the second npn output transistor and to a load current output of the amplifier; and
negative feedback means, coupled between the emitter and the base of the first npn output transistor and coupled between the emitter and the collector of the first npn output transistor, for providing a negative feedback current to the first npn output transistor over a predetermined output current range and for limiting the negative feedback current provided to the first npn output transistor to a preselected maximum value.

17. In a push-pull amplifier circuit having first and second output transistors, a negative feedback arrangement comprising:
feedback circuitry, coupled between the emitter and the base of the first output transistor and coupled between the emitter and the collector of the first output transistor, for providing a negative feedback current to the first output transistor over a predetermined output current range; and
limiting circuitry for limiting the negative feedback current provided to the first output transistor to a preselected maximum value.

18. The arrangement according to claim 17, wherein the feedback circuitry comprises a plurality of current mirror transistors, and wherein the limiting circuitry comprises at least one current source and a current limiting resistor.

* * * * *